(12) United States Patent
Watanabe et al.

(10) Patent No.: US 7,088,565 B2
(45) Date of Patent: Aug. 8, 2006

(54) LOAD DRIVE CONTROL APPARATUS WITH PERFORMANCES OF POWER-CONSUMPTION REDUCTION AND OVERHEAT PROTECTION

(75) Inventors: Hideo Watanabe, Kariya (JP); Makoto Ito, Okazaki (JP)

(73) Assignee: Denso Corporation, Kariya (JP)

( * ) Notice: Subject to any disclaimer, the term of this patent is extended or adjusted under 35 U.S.C. 154(b) by 364 days.

(21) Appl. No.: 10/411,374

(22) Filed: Apr. 11, 2003

(65) Prior Publication Data

US 2004/0201938 A1 Oct. 14, 2004

(30) Foreign Application Priority Data

Apr. 12, 2002 (JP) ............................ 2002-110639

(51) Int. Cl.
*H02H 5/04* (2006.01)
*H02J 1/00* (2006.01)
(52) U.S. Cl. ...................... 361/103; 323/351
(58) Field of Classification Search ............... 361/103; 323/351

See application file for complete search history.

(56) References Cited

U.S. PATENT DOCUMENTS 4,309,675 A * 1/1982 Rabe ........................ 331/172
6,232,758 B1 5/2001 Konda et al.
6,384,577 B1 5/2002 Kikuchi et al.
6,747,300 B1 * 6/2004 Nadd et al. ................. 257/288
2002/0021539 A1 * 2/2002 Odaohhara et al. ......... 361/103

FOREIGN PATENT DOCUMENTS

| JP | 2-266408 | 10/1990 |
|---|---|---|
| JP | 2000-115997 | 4/2000 |
| JP | 2001-161026 | 6/2001 |
| JP | 2001-257818 | 9/2001 |

* cited by examiner

*Primary Examiner*—Brian Sircus
*Assistant Examiner*—Boris Benenson
(74) *Attorney, Agent, or Firm*—Posz Law Group, PLC

(57) ABSTRACT

A load drive control apparatus comprises a drive control circuit and a mode switchover circuit. The drive control circuit, which operates under a driving power, for driving/controlling a load on a control signal. The drive/control of the load includes an overheat protection control with a hysteresis characteristic carried out on a temperature of a component of the drive control circuit and/or the load. The overheat protection control involves a drive-limiting operation to stop a drive of the load. The mode switchover circuit switches over the drive control circuit between a normal mode and a stand-by mode responsively to the control signal. The stand-by mode is less in driving power consumption than the normal mode. The stop of the drive of the load is maintained during the drive-limiting operation whatever the control signal indicates, as long as the temperature is higher than a lower limit of the hysteresis characteristic.

19 Claims, 10 Drawing Sheets

LOAD DRIVE CONTROL APPARATUS WITH PERFORMANCES OF POWER-CONSUMPTION REDUCTION AND OVERHEAT PROTECTION

BACKGROUND OF THE INVENTION

1. The Field of the Invention

The present invention relates to an apparatus for driving and controlling a load that operates on an electric power source, and in particular, to the apparatus that has the capability of not only reducing electric power consumed by the load but also protecting an overheat occurring in the load and/or the apparatus.

2. Related Art

An apparatus for driving and controlling a load (hereafter, referred to as a "load drive control apparatus") has been used widely by various types of equipment. Such an apparatus is applied to, for example, a blower motor and a cooling fan motor, which are incorporated in an air conditioner mounted on an automobile. Both of the blower motor and cooling fan motor are loads to be driven and controlled by the load drive control apparatus.

In such a system, it is required that electric power unnecessarily consumed by the motors during their non-operating periods of time is suppressed as less as possible. To try to satisfy such a request, there is proposed a technique disclosed by a U.S. Pat. No. 6,232,758 B1. This publication teaches a load drive control apparatus that is able to switch its operations between a normal operation mode and a stand-by operation mode, without using a large-size relay and applying an on/off signal to an ignition switch.

In this load drive control apparatus, if foreign materials creep into the rotation unit of for example a blower motor, the motor's torque is sometimes forced to increase or the motor is sometimes locked. If such a situation happens in fact, current flows, in most cases, excessively through switching elements composing part of the load drive control apparatus and/or the blower motor, which results in a sharp increase in the temperature at those switching elements and/or the blower motor. Thus, it is preferable to have overheat protection/control means of limiting the motor drive on the basis of temperature detected by a temperature sensor placed at, for example, a position nearer to the switching elements.

FIGS. 1A and 1B show changes in the temperature detected from a configuration, in which both of the foregoing load drive control apparatus and the overheat protection/control means are simply combined with each other, which is in an overload operation. FIG. 1A shows changes in the temperature in cases where a transition to an overheat-protecting operation was followed by an automatic stop of a blower switch but a user kept ignoring the on-state of the blower switch. Meanwhile, FIG. 1B shows changes in the temperature in cases where, in such a case, a user who noticed the stop of the blower fan doubtfully turned off the blower switch and then turned it on again.

In FIGS. 1A and 1B, a drive command signal is a signal to command the rotation of a blower and is given by an ECU of an air conditioner when the blower switch is on. A drive signal is made into an on/off signal for the switching elements when a drive control signal performs both of the control of the number of rotations based on a drive command signal and the overheat protection control. The foregoing load drive control apparatus makes a transition from its normal operation mode to its stand-by operation mode when the blower switch was manipulated into its off-state to stop the issue of the drive command signal. In response to this transition, supplying power to the drive control circuit that is in charge of driving the switching elements is stopped as well.

In the case of FIG. 1A, since the blower switch is kept to its on-state, the normal mode continues, thus the power being supplied to the drive control circuit without rest. Hence, the drive control circuit is capable of continuously executing an overheat protection control, in which the detected temperature is subjected control that allows changes within a temperature width regulated by both a predetermined protective temperature T1 and a predetermined release temperature T2. Because there is thermal resistance between the switching sensors and the temperature sensor, a chip temperature within each switching element (that is, a junction temperature) becomes higher than a detected temperature by the temperature sensor. However, the switching elements, which were turned off once, is again subjected to its on-operation when the detected temperature reduces down to the release temperature T2, whereby the chip temperature is limited to temperature less than its guarantee temperature.

On the other hand, in the state shown in FIG. 1B, the blower switch is manually turned off at a certain timing during the overheat protection control, resulting in that the power to the drive control circuit is once shut down. Hence the drive control circuit is reset, which loses the information indicative of states of the overheat protection control carried out before the shutdown. It is therefore possible for the drive control circuit to turn on the switching elements, if the temperature detected when the re-supply of the power is started is below the protective temperature T1. However, the blower switch is manually turned on and off in sequence after the detected temperature reached the protective temperature T1, there will be caused a fear that the chip temperature is beyond a guarantee temperature of the chips (refer to a range shown by a reference "A" in FIG. 1B). The reason is that, conjointly with an overload state (for instance, a motor locked state) bringing about a sharp increase in current, the drive control circuit is obliged to turn on the switching elements that should originally be turned off due to a high detected temperature.

In order to prevent such an unwanted overheating situation, there can be provided some countermeasures, including 1) a decrease in the protective temperature T1, 2) to embed a temperature sensor within the switching elements to measure a chip temperature with precision, and 3) to dispose, into the drive control circuit, non-volatile means for maintaining information indicative of controlled states. However, the means according to 1) is disadvantageous in that unfavorable conditions, such as higher surrounding temperature, will lead to frequent stops of the blower fan under the overheat protecting operation even in the normal use, thus spoiling user's amenity. Further, means according to 2) and 3) are difficult to employ, because a greater increase in the production cost of the system is inevitable.

SUMMARY OF THE INVENTION

An object of the present invention is to provide, with due consideration to the drawbacks of the above conventional means, a load drive control apparatus, which has the capability of operating in a stand-by mode and performing overheat protection, that is able to conduct overheat protection without fail, without using the protective temperature reduced in level compared to the conventional.

In order to accomplish the above object, the present invention provides an apparatus (1) for driving and controlling a load (4), comprising: a drive control circuit (8, 61), which operates under a driving power, for driving and controlling the load on the basis of a control signal, the drive and control of the load including an overheat protection control with a hysteresis characteristic carried out on the basis of a temperature of at least one of a component placed in the drive control circuit and the load, the overheat protection control involving a drive-limiting operation carried out to stop a drive of the load when an overheat state is detected based on the temperature, the hysteresis characteristic having an upper temperature and a lower temperature; and a mode switchover circuit (6) for switching over the drive and control of the drive control circuit between a normal mode and a stand-by mode in response to the control signal, the stand-by mode being less in consumption of the driving power than the normal mode, wherein either the drive control circuit or the mode switchover circuit has means for maintaining the stop of the drive of the load during the drive-limiting operation whatever the control signal indicates, as long as the temperature is larger than the lower limit.

Accordingly, based on the control signal for driving and controlling the load, the supply of the driving power is controlled. That is, by the mode switchover circuit, the normal mode requiring a predetermined amount of power is set to supply the driving power itself when it is required to drive the load. In contrast, when the load is unnecessary to drive, set is the stand-by mode that requires a less amount of power (including the shutdown of the driving power; an amount of power to be supplied is zero) than that required by the normal mode. This mode switchover reduces the amount of power to be consumed unnecessarily.

In the normal mode, the load is driven in response to the control signal and overheat protection control with a hysteresis characteristic is carried out using a temperature detected from a component placed in the drive control circuit and/or the load. During a period of the overheat protection control, a drive-limiting operation is carried out to stop the drive of the load. As long as the temperature is larger than a lower limit of the hysteresis characteristic, the maintaining means maintains the stop of the drive of the load during the drive-limiting operation whatever the control signal indicates a state to be controlled. Therefore, the temperature at the component placed in the drive control circuit and/or the load can be controlled steadily and accurately within the upper and lower limits defined by the hysteresis characteristic. Without lowering a protective temperature (that is, the upper limit of the hysteresis characteristic), the temperature at the component (for example, switching elements) placed in the drive control circuit and/or the load can be prevented from its excessive rise in temperature.

Preferably, the mode switchover circuit includes, as the maintaining means, means configured to prohibit a transition from the normal mode to the stand-by mode during the drive-limiting operation. By way of example, wherein the normal mode is a mode allowing the driving power to be supplied to the load and the stand-by mode is a mode allowing the driving power to be stopped from being supplied to the load.

Still preferably, the he apparatus further comprises a power supply circuit (7) for supplying the driving power to the drive control circuit, wherein the mode switchover circuit is configured to allow the power supply circuit to mutually switch over the drive and control of the drive control circuit between the normal mode and the stand-by mode in response to the control signal. For example, the drive control circuit has an overheat protection processor (18) for performing the overheat protection control that starts the drive-limiting operation responsively to a condition that the temperature reaches the upper limit (T1) and ends the drive-limiting operation responsively to another condition that the temperature is equal to or lower than the lower limit (T2; T2<T1)).

It is preferred that the drive control circuit includes a temperature sensor (17) to detect the temperature at the component of the drive control circuit. The drive control circuit includes, for example, a drive circuit (10) in which switching elements (11 to 16) is provided, as the component of the drive control circuit, to output current to the load and a control circuit (9) for enabling an on/off control to be performed at the drive circuit for driving and controlling the load and performing the overheat protection control.

It is also preferred that the mode switchover circuit includes a capacitor (27); a charge/discharge switchover circuit (23) configured to allow the capacitor to be charged or discharged selectively in response to a switchover-control signal; a switchover-signal production circuit (21, 22) configured to supply the control signal as the switchover-control signal during a period of time during which the drive-limiting operation is not carried out and to supply a charge-operation signal to command a charge of the capacitor during another period of time during which the drive-limiting operation is carried out; and a power-supply control circuit (28, 29) configured to control the power supply circuit into a power-supplied state thereof in cases where a terminal voltage of the capacitor is equal to or higher than a predetermined switchover level and to control the power supply circuit into a power-stopped state thereof in cases where the terminal voltage of the capacitor is lower than the predetermined switchover level.

An alternative for this configuration is that the mode switchover circuit includes a capacitor (27); a charge/discharge switching-over circuit (23) configured to allow the capacitor to be charged or discharged selectively in response to a switchover-control signal; and a power-supply control circuit (21, 22, 28, 29) configured to selectively control the power supply circuit into a power-supplied state or a power-stopped state thereof in accordance with a terminal voltage of the capacitor, a switchover to the power-supplied state being prohibited during a period of time during which the overheat-protecting operation is carried out.

In those configurations, the terminal voltage of the capacitor can be used for setting the normal and stand-by modes. The capacitor functions as one kind of filter, thereby providing resistance to exotic noise. Erroneous switchovers can be prevented, providing stable mode-switchover actions.

As another example, the drive control circuit includes, as the maintaining means, means for starting the overheat protection control that involves the drive-limiting operation in response to a condition that the temperature reaches the upper limit (T1), for determining whether or not the temperature is over a middle limit (T3) responsively to an issue of the control signal indicating the drive of the load, and for prohibiting the drive of the load until the temperature becomes equal to or smaller than the lower limit (T2; T2<T3<T1), in cases where the determination reveals that the temperature is still over the middle limit.

Another preferred example is that the drive control circuit includes, as the maintaining means, means for memorizing information indicative a temperature rise when the temperature reaches the upper limit, means for determining whether or not the information has been memorized in response to an issue of the control signal indicating the drive of the load; and means for prohibiting the drive of the load until the temperature becomes equal to or smaller than the lower limit, in cases where the determination reveals that the information has been memorized.

Still anther preferred example is that he drive control circuit includes, as the maintaining means, means for actuating a timer to count a predetermined period of time when the temperature reaches the upper limit, means for determining whether or not the timer has been actuated in response to an issue of the control signal indicating the drive of the load; and means for prohibiting the drive of the load until the temperature becomes equal to or smaller than the lower limit, in cases where the determination reveals that the timer has been actuated.

By way of example, the drive control circuit is made of a low-power-consumption type of circuit manufactured through a CMOS (complementary metal-oxide semiconductor) process.

DETAILED DESCRIPTION OF THE PREFERRED EMBODIMENTS

Embodiments of the present invention will now be described in conjunction with the appended drawings.

First Embodiment

Referring to FIGS. 2 to 5, a first embodiment of the present invention will now be described, in which a load drive control apparatus according to the present invention is applied to the drive of an air conditioner mounted to a vehicle.

Figure 2:
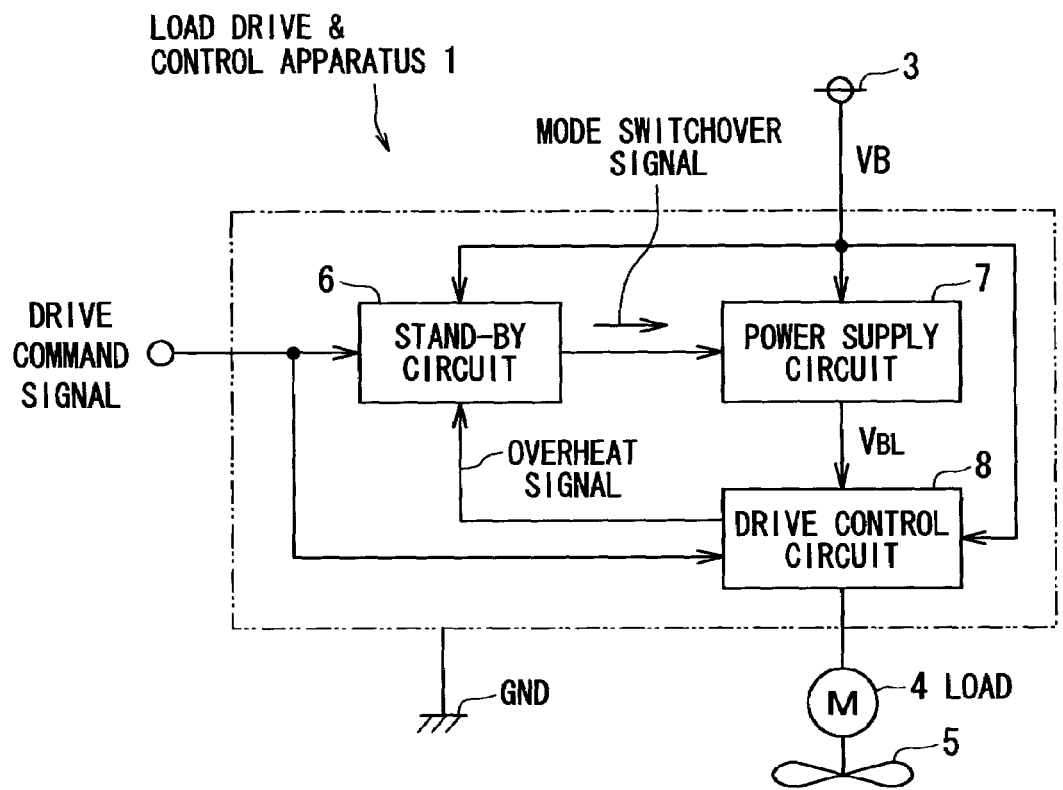
FIG. 2 is a functional block diagram showing the entire electrical configuration of a load drive control apparatus according to a first embodiment of the present invention.

FIG. 2 shows an entire functional configuration of the load drive control apparatus 1. As shown in FIG. 2, the load drive control apparatus 1 is placed to drive the rotation of a brushless motor 4 (hereafter referred to as a motor) that serves as a load for the apparatus 1. Specifically, the load drive control apparatus 1 receives a battery voltage VB from a battery 2 (refer to FIG. 4) via a power supply line 3 and the ground GD and control of the motor 4 based on a drive demand signal (functioning as a control signal of the present invention) given by a not-shown ECU of the air conditioner.

The motor 4 has a rotating shaft to which a blower fan 5 (hereafter referred to as a fan) 5 of the car air conditioner is coupled. The fan 5 is arranged away from an instrument panel so as to be located in a dashboard of the vehicle. The fan 5 is in charge of circulating, through the vehicle compartment, air cooled by, for instance, an evaporator (not shown) in response to an amount of air specified by the drive command signal.

The load drive control apparatus 1 has a stand-by circuit (functioning as mode switching-over means), a power supply circuit 7, and a drive control circuit 8. Of these, the stand-by circuit 6, which operates responsively to the supply of the battery voltage VB, responds to an amount of the number of rotations of the motor 4, which is given by the drive command signal, and an overheat signal given from the drive control circuit 8. Responsively to the amount and signal, the stand-by circuit 6 produces a mode switch-over signal, and sends the produced signal as an output to the power supply circuit 7.

The power supply circuit 7 is directly connected to the power supply line 3, without being routed to switches such as relays, and operates to a mode switchover signal. That is, in response to the mode switchover signal, the circuit 7 performs switchovers between a "normal mode" and a "stand-by mode." The normal mode is used for supplying driving power $V_{BL}$ to the drive control circuit 8, while the stand-by mode is used when supplying the driving power $V_{BL}$ is stopped to prevent the power from being consumed excessively. When the stand-by mode is established, current consumed by both of the power supply circuit 7 and the drive control circuit 8 is remarkably reduced down to an amount (for instance, 1 mA or less), compared to the normal mode.

In the normal mode, the drive control circuit 8 receives the driving power $V_{BL}$ from the power supply circuit 7 and is in charge of not only driving/controlling the motor 4 in response to the drive command signal but also conducing overheat protection control. In contrast, in the stand-by mode, the drive control circuit 8 will stop its driving/controlling operations and overheat protection control, because the supply of the driving power $V_{BL}$ is shut down.

Figure 3:
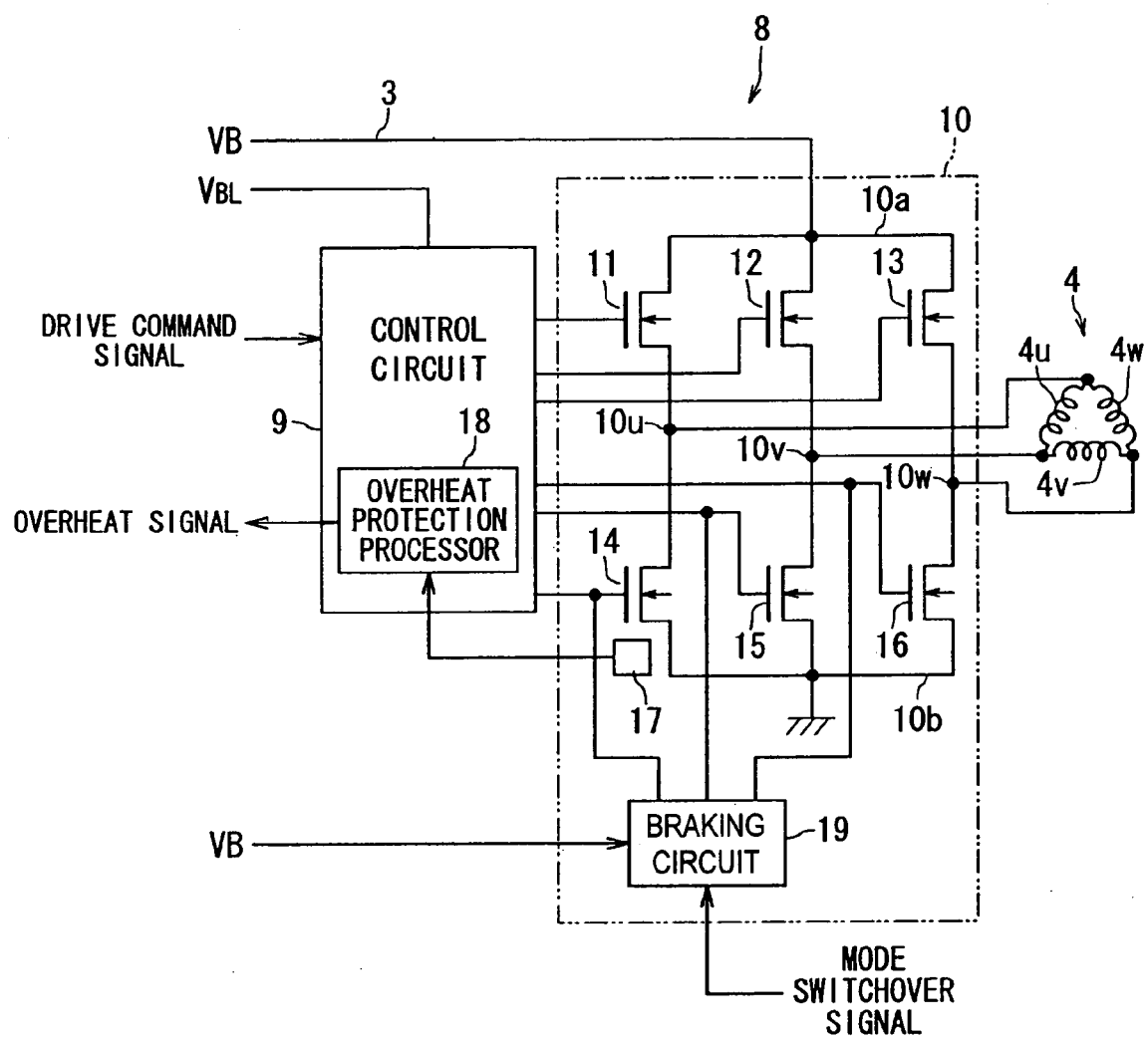
FIG. 3 shows the electrical configuration of a drive control circuit disposed in the load drive control apparatus.

FIG. 3 details the electrical configuration of the drive control circuit 8. As shown in FIG. 3, the drive control circuit 8 is provided with a control circuit 9, a drive circuit, and a braking circuit 19, which are made of hardware circuitry. The drive circuit 10 has positive-side and negative-side bus lines 10a and 10b, which are coupled with the power supply line 3 and the ground GND, respectively. The power-supply terminal of the control circuit 9 is connected to the power-supply terminal of the power supply circuit 7. In cases where the driving power $V_{BL}$ is stopped from being supplied, the operation of the control circuit 9 will be reset.

The drive circuit 10 includes an inverter consisting of n-channel power MOSFETs (hereafter referred to as FETs) 11 to 16 mutually connected into a three-phase bridge form. The FETs correspond to components and switching elements of the present invention. At each of the FETs 11 to 16, a not-shown freewheeling diode is connected its source and drain (or the diode is integrally embedded in each element).

The FETs 11 to 16 are attached to a common radiator plate that is not shown and a temperature sensor 17, which is for example a thermistor, is located at a position on the radiator plate, at which the temperature of the FETs can be detected most correctly. The temperature sensor 17 serves as temperature detecting means of the constituents of the present invention. Both of the radiator and the FETs 11 to 16 are placed to be air-cooled forcibly with the wind produced by the fan 5.

In the control circuit 9 is provided a not-shown controlling power supply circuit. This controlling power supply circuit produces, from the driving power $V_{BL}$, such as 14 V, supplied from the power supply circuit 7, to controlling power, such as 5 V, for instance. The produced controlling power is delivered to the internal circuits in the control circuit 9. In addition, the drive control circuit 9 has an overheat protection processor 18 to perform a hysteresis-type of overheat protection control on the basis of a signal from the temperature sensor 17. Through the overheat protection control, a high-level overheat signal is produced and outputted under an overheat-protecting operation during which all the FETs 11 to 16 are brought into off-states.

The motor 4 has three-phase stator coils 4u, 4v and 4w mutually related in a delta connection. The common connected points between the coils 4u and 4v, between the coils 4v and 4w, and between the coils 4w and 4u, output terminals 10u, 10v and 10w of the drive circuit 10, respectively. To the gates that compose negative-side arms of the drive circuit 10, output terminals of the braking circuit 19 (corresponding to braking means of the present invention) are coupled, respectively.

To the braking circuit 19 is directly supplied a battery voltage VB of the battery 2. If the mode switchover signal shows the stand-by mode, the braking circuit 19 takes over the control of the gate drive circuit arranged in the control circuit 9 so that the braking circuit 19 turns on the gates of the FETs 14 to 16. By contrast, the mode switchover signal shows the normal mode, the braking circuit 19 will provide a high impedance value at its output terminals connected to the gates of the FETs 14 to 16.

Figure 4:
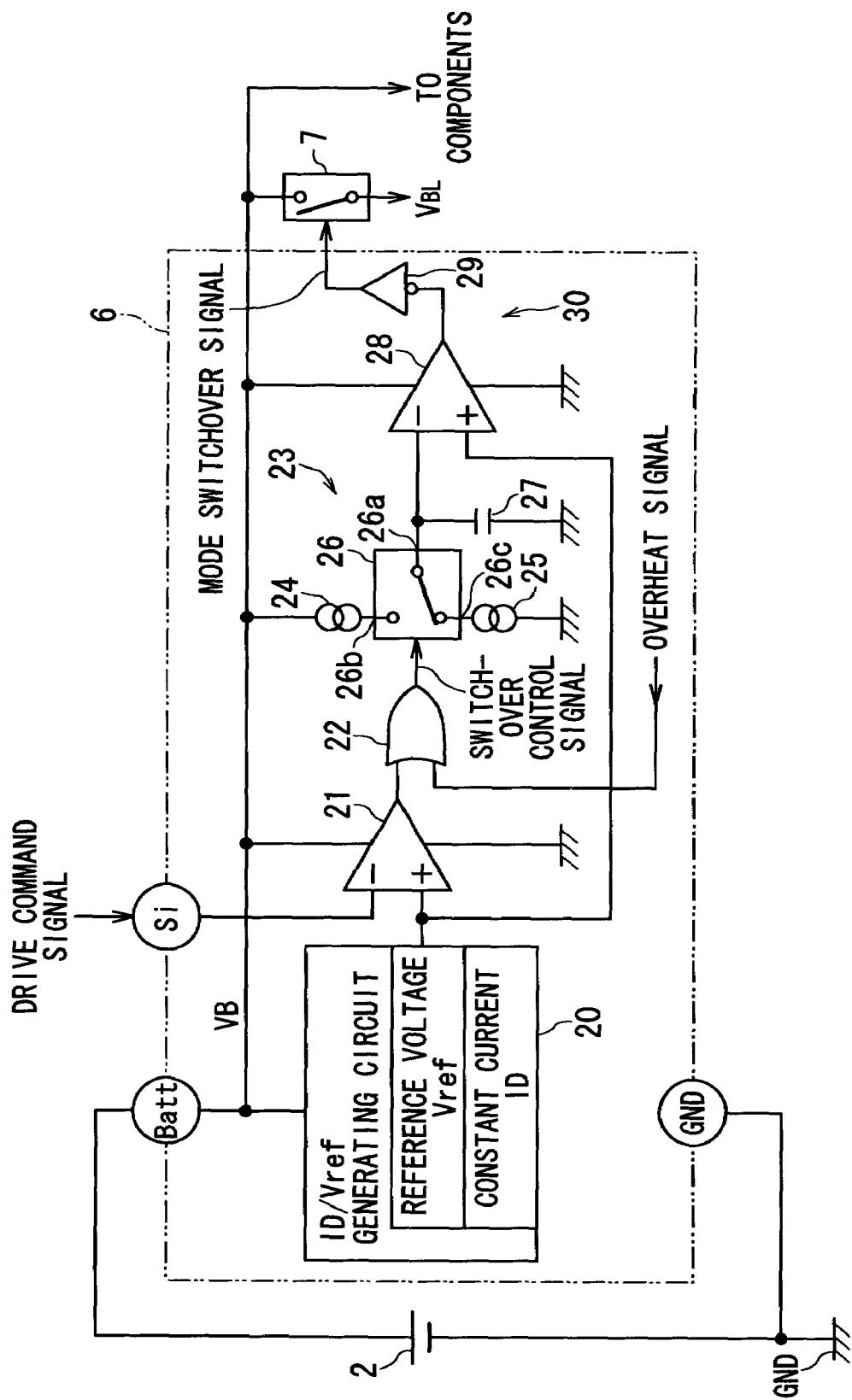
FIG. 4 shows the electrical configuration of both of a stand-by circuit and a power supply circuit disposed in the load drive control apparatus.

FIG. 4 explains in more detail the electrical configurations of the stand-by and power supply circuits 6 and 7. As illustrated in FIG. 4, the battery 2 is provided to be connected to an ID/Vref generating circuit 20 included in the stand-by circuit 6. Using the battery terminal VB from the battery 2, the ID/Vref generating circuit 20 generates both of a constant current ID and a reference voltage Vref, which are sent to each component requiring such current and voltage within the stand-by circuit 6.

The reference voltage Vref, which is outputted by the ID/Vref generating circuit 20, is sent to a noninverting input terminal of a comparator 21. To the inverting input terminal of the comparator 21 is provided an external drive command signal, The output terminal of the comparator 21 is connected to one input terminal of an OR gate 22 (corresponding to a switchover signal generating circuit of the present invention). And the remaining input terminal of the OR gate 22 is configured to receive the foregoing overheat signal. An output signal from the OR gate 22 is sent to a charge/discharge switchover circuit 23 as a signal for controlling the switchovers of the mode.

The drive command signal has the capability of specifying the number of rotations of the motor 4 based on, for example, the duty ratio of the low level during one period of a pulse signal. When the low-level duty ratio becomes 20% or more (corresponding to a drive start condition), the drive control circuit 8 makes the motor start to its drive and performs the control of the number of rotations of the motor 4.

The charge/discharge switchover circuit 23 is provided with a charge circuit 24, a discharge circuit 25, and a switchover control circuit 26. The switchover control circuit 26, which is symbolized by a switchover switch, responds to a switchover control signal from the OR gate 22 so that a non-grounded terminal (i.e., output terminal 26a) of a capacitor 27 is selectively coupled with one terminal of the charge circuit 24 or the discharge circuit 25 (i.e., input terminal 26b or 26c). Practically, the switchover control circuit 26 is composed of circuitry including transistors.

The other terminal of each of the charge and discharge circuits 24 and 25 is linked with each of the battery 2 and the ground GND, Through this linkage, it can be predetermined so that a ratio between charge/discharge currents passing through the capacitor 27 is substantially equal to a low-level duty ratio of the drive command signal that corresponds to a threshold used for making switchovers between the normal and stand-by modes. The threshold therefore corresponds to a mode switching-over threshold in the present invention.

The switchover control circuit 26 has an output terminal 26a connected to an inverting input terminal of a comparator 28. A non-inverting input terminal of the comparator 28 receives the reference voltage Vref outputted from the ID/Vref generating circuit 20. An output terminal of the comparator 28 is routed via an inverter 29 to a control signal terminal of the power supply circuit 7 symbolized by a switch. This makes it possible to provide the power supply circuit 7 with the mode switchover signal. Both of the comparator 28 and the inverter 29 compose a power supply control circuit 30.

Figure 5:
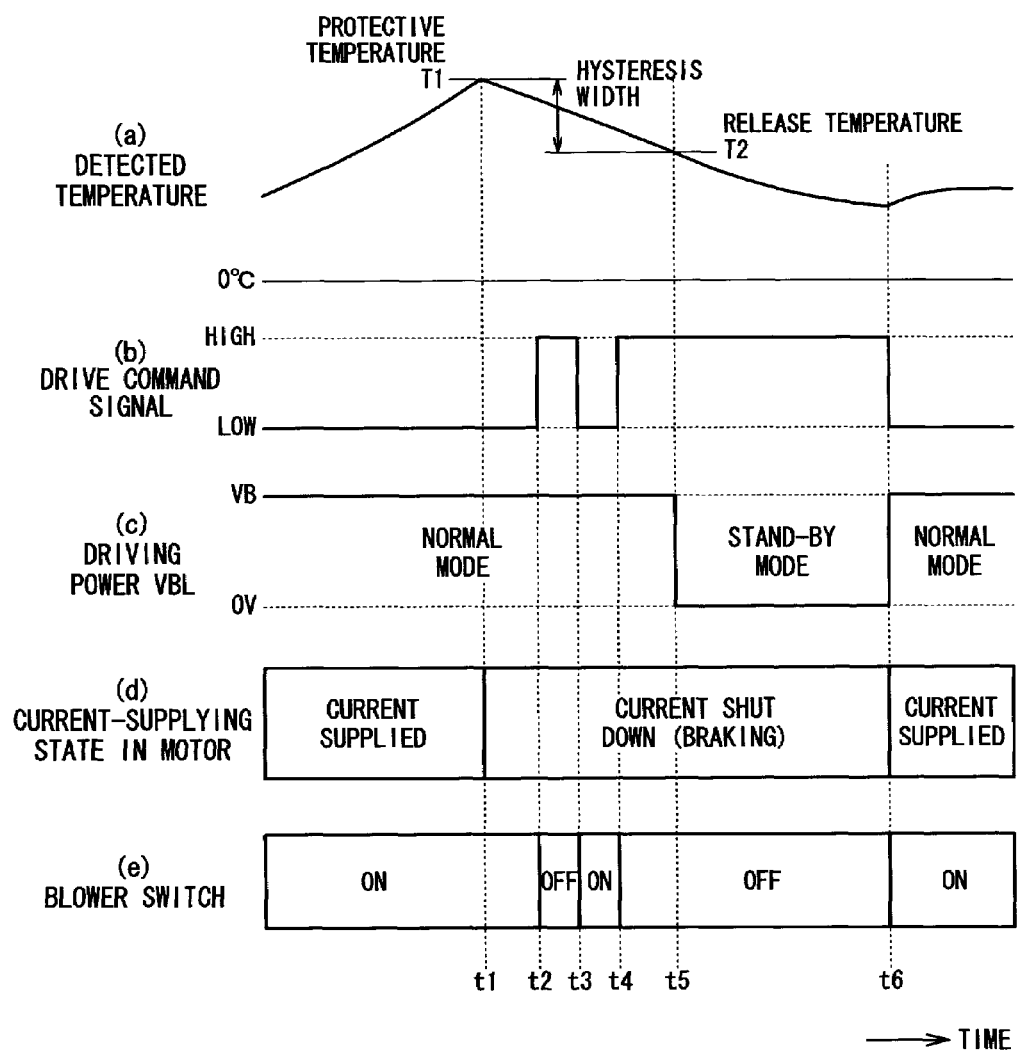
FIG. 5 illustrates operations realized when a blower switch is turned on and off in sequence.

Referring to FIG. 5, the operation of the present embodiment will now be described.

In the case that the blower switch (not shown) disposed on the instrument panel is in an off-state, the ECU of the air conditioner provides the load drive control apparatus 1 with a drive command signal indicating an amount of wind "zero," so that the motor 4 is kept stopping from its operation. The drive command signal in this state is a high-level constant signal, which is 0% in the low-level duty ratio. Meanwhile, in cases where the blower switch is in an on-state (that is, in any of Lo, Mid, and Hi levels), the air conditioner ECU will provide the load drive control apparatus 1 with a drive command signal that commands a desired number of rotations corresponding to an amount of wind to be set. The drive command signal in this state has a particular low-level duty ratio in response to the desired number of rotations.

The load drive control apparatus 1 carries out various types of control as described below.

(i) Control for Driving Rotations

In this control, a voltage to be applied to the motor 4 is controlled such that the number of rotations of the motor 4 is made to agree with a specified number of rotations given by the drive command signal.

(ii) Control for Protecting Overheat

This control is activated when the temperature detected from the FETs 11 to 16 becomes higher than a predetermined protective temperature. Until the detected temperature falls down lower than a predetermined a control-release temperature, the motor 4 is kept stopping from its rotation, only its braking operation being allowed.

(iii) Control for Saving Consumed Power

In cases where a specified number of rotations given from the drive command signal is equal to or less than a predetermined value, the operation mode is transferred from the normal mode to the stand-by mode, thus saving power to be consumed.

First of all, the control for driving rotations of the motor 4 will now be described.

In the normal mode, the driving power $V_{BL}$ is supplied from the power supply circuit 7 to the control circuit 9 in the drive control circuit 8. Thus, the control circuit 9 detects the position of the rotor of the motor 4 in response to a signal from a not-shown position sensor for the rotor. And, at predetermined timings defined by the detected rotational positions of the rotor, the control circuit 9 sends gate signals to the gates of the FETs 11 to 16, the gate signals having a difference of 120 degrees from each other corresponding each phase, which will drive the motor 4, thus driving the rotation of the fan 5. Such a driving way has been widely known.

On the other hand, in the stand-by mode, because the driving power $V_{BL}$ will not be supplied to the drive control circuit 8, the control circuit 9 cannot drive the FETs 11 to 16. Hence, during a period of time in which the stand-by mode is instructed by the mode switchover signal, the braking circuit 19 takes over the control of the FETs 11 to 16 from the control circuit 9. That is, the braking circuit 19 turns on the FETs 11 to 16 on behalf of the control circuit 9, resulting in that each of the phase windings 4u, 4v and 4w being connected to the ground potential. In this case, the braking circuit 19 is able to employ either one of the ways of continuously driving the FETs 11 to 16 and of intermittently driving the FETs 11 to 16 at intervals. This braking control makes it possible that the motor 4 can be braked even when, for example, the fan 5 receives a torque due to the introduction of a fresh air.

The overheat protection control will now be explained.

In the control circuit 9, the overheat protection processor 18 detects a temperature using the signal coming from the temperature sensor 17. This detected temperature show a value closer to the actual package temperature of the FETs 11 to 16. When the detected temperature exceeds a predetermined protective temperature T1 (refer to FIG. 5), the overheat protection processor 18 brings the level of an overheat signal into its high and turns off the FETs 11 to 16 (that is, overheat-protecting operation). On realizing that the detected temperature is below a predetermined release temperature T2 (<T1), the overheat protection processor 18 brings the overheat signal into its low level and concurrently responds to the command signals to drive the on/off operations of the FETs 11 to 16 according to the foregoing current supply manner. As a result, the detected temperature is regulated between the protective and release temperatures T1 and T2 that provides a hysteresis temperature width, thereby protecting the FETs from being destroyed on account of the overheat.

The control for saving consumed power will now be explained.

The drive command signal has a low-level duty ratio determined by an amount of wind to be specified, in which the low level is 0 V and the high level is 5 V. This drive command signal is subjected to comparison with the reference voltage Vref (for instance, 3.75 V) at the comparator 21. If the overheat signal presents its low level, the compared signal becomes a switchover control signal without receiving any processing. When this switchover control signal is in its high level (namely, the drive command signal is in its low level), the capacitor 27 is charged with a current of 190 26. By contrast, when the switchover control signal is in its low level (namely, the drive command signal is in its high level), the capacitor 27 is subjected to discharge together with a current of 10 µA flowing through the switchover control circuit 26 and the discharge circuit 25. Through the flow of the charging and discharging currents, the terminal voltage of the capacitor 27 is reduced or increased depending on the fact that the low-level duty ratio of the drive command signal is below 5%, or, equal to or higher than 5%, respectively.

The terminal voltage is then subject to the comparison with the reference voltage Vref at the next comparator 28. The resulted signal is then inverted by the inverter 29, the inverted signal being sent out as a mode switchover signal. Thus, if the low-level duty ratio of the drive command signal is below 5% due to turning off the blower switch, the mode switchover signal becomes its low level (0 V), thereby being transferred to the stand-by mode wherein the driving power $V_{BL}$ from the power supply circuit 7 to the drive control circuit 8 is stopped from being supplied. On the other hand, in the case that the blower switch is turned on and the drive command signal shows a low-level duty ratio over 5%, the mode switchover signal becomes its high level (5 V), being transferred to the normal mode. Hence, the driving poser $V_{BL}$ is supplied from the power supply circuit 7 to the drive control circuit 8. By the way, to give the hysteresis characteristic to the mode switchovers, the ID/Vref generating circuit 20 generates the reference voltage Vref of which amount is slightly reduced once the operation mode has been transferred from to the stand-by mode.

Next, the operations will now be given the situation where the blower switch is turned on and off in sequence during a period of the overheat-protecting operation. Such operations may occur in cases where a user, who noticed the fan 5 that had stopped in response to the overheat-protecting operation, turned temporarily the blower switch, and then turned off the blower switch.

FIG. 5 shows the detected temperature (FIG. 5(a)), drive command signal (FIG. 5(b)), driving power $V_{BL}$ (FIG. 5(c)), current-supplying state in the motor (FIG. 5(d)), and on/off states in the blower switch (FIG. 5(e)). The drive command signal is in its low level (that is, a 100% of low-level duty ratio) when the blower switch is in its on-state (switched to Hi), while is in its high level (that is, a 0% of low-level duty ratio) when the blower switch is in its off-state.

It can be imagined that, for example, if foreign materials are obliged to be put into the rotation part of the fan 5 during its rotation, the motor torque is forced to rise. In such a case, the current flowing from the drive circuit 10 to the motor 4 is increased, resulting in that an amount of heat to be generated from the FETs 11 to 16 is raised. As a result, the detected temperature from the FETs 11 to 16 shows a sharp increase. Responsively to the fact that the detected temperature becomes higher than the predetermined protective temperature T1 at a time instant t1, the overheat protection processor 18 turns the FETs 11 to 16 off, as described in the above overheat protection control. This overheat protection control makes the fan 5 stop its rotation, the user frequently turns the blower switch off, on, and to off in sequence at time instants t2, t3 and t4.

Responsively to turning the blower switch off, the drive command signal is brought into its high level showing the stop of the fan. However, the overheat signal is also in its high level during a period of overheat-protecting operation. Hence the switchover control signal, which is outputted from the OR gate 22, is kept to its high level, whatever the drive command signal takes which level. Therefore, the mode switchover signal is kept to its high level, the switchover from the normal mode to the sand-by mode being prohibited.

The temperature of the FETs 11 to 16, once brought into their off-states, is lowered gradually, so that it is possible that the detected temperature is below the predetermined release temperature T2 at a time instant t5. This reduction in the detected temperature makes the overheat-protecting operation end, thereby bringing the overheat signal into its low level. The OR gate 22 outputs the switchover control signal having a low level, which corresponds to the level of the drive command signal. Hence, the mode switchover signal is changed to its low level, thus the operation mode being switched over from the normal mode to the stand-by mode. In consequence, supplying the driving power $V_{BL}$ to the drive control circuit 8 is stopped so that the power of the drive control circuit 8 is reset. Then, at a time instant t6 when the blower switch is turned on again, the detected temperature has already been reduced down below the predetermined release temperature T2. Therefore, even if the overheat-protecting operation is started from the above reset state, there will occur no situation where the FETs 11 to 16 are destroyed due to overheating.

As described above, in the load drive control apparatus 1 according to the present embodiment, the drive command signal is used for the transition to the stand-by mode, in which supplying the driving power $V_{BL}$ to the drive control circuit 8 is stopped. Hence, without employing relays and utilizing the signal from an ignition switch, the power to be consumed can be reduced.

Furthermore, in the load drive control apparatus 1, a temperature is detected at a position nearer to the FETs 11 to 16 to conduct the overheat-protecting operation with the hysteresis characteristic of temperatures. In addition to this overheat-protecting operation, the transition from the normal mode to the stand-by mode is prohibited during the overheat-protecting operation. Hence it is avoidable that the control is forced to be reset during the overheat-protecting operation. Therefore, once the detected temperature exceeded the predetermined protective temperature T1, the FETs 11 to 16 keep stopping the rotational drive of the motor 4 until the detected temperature becomes below the predetermined release temperature T2, however a user may operate the blower switch. The detected temperature will thus change within a predetermined width of temperatures based on the hysteresis characteristic. Accordingly, control fully handled between the limit temperatures can be performed, with the result that it is unnecessary to lower the protective temperature but a temperature at the chip of the FETs 11 to 16 can be limited to a level below a desired guarantee temperature.

In addition, the terminal voltage of the capacitor 27 is subjected to comparison with the reference voltage Vref to perform the mode switchovers. Therefore, even if exotic noise impinges on the stand-by circuit 6, influence of the noise can be avoided by smoothing the level of the noise with the use of the capacitor 27, thereby ensuring the mode switchover operations.

Second Embodiment

Figure 6:
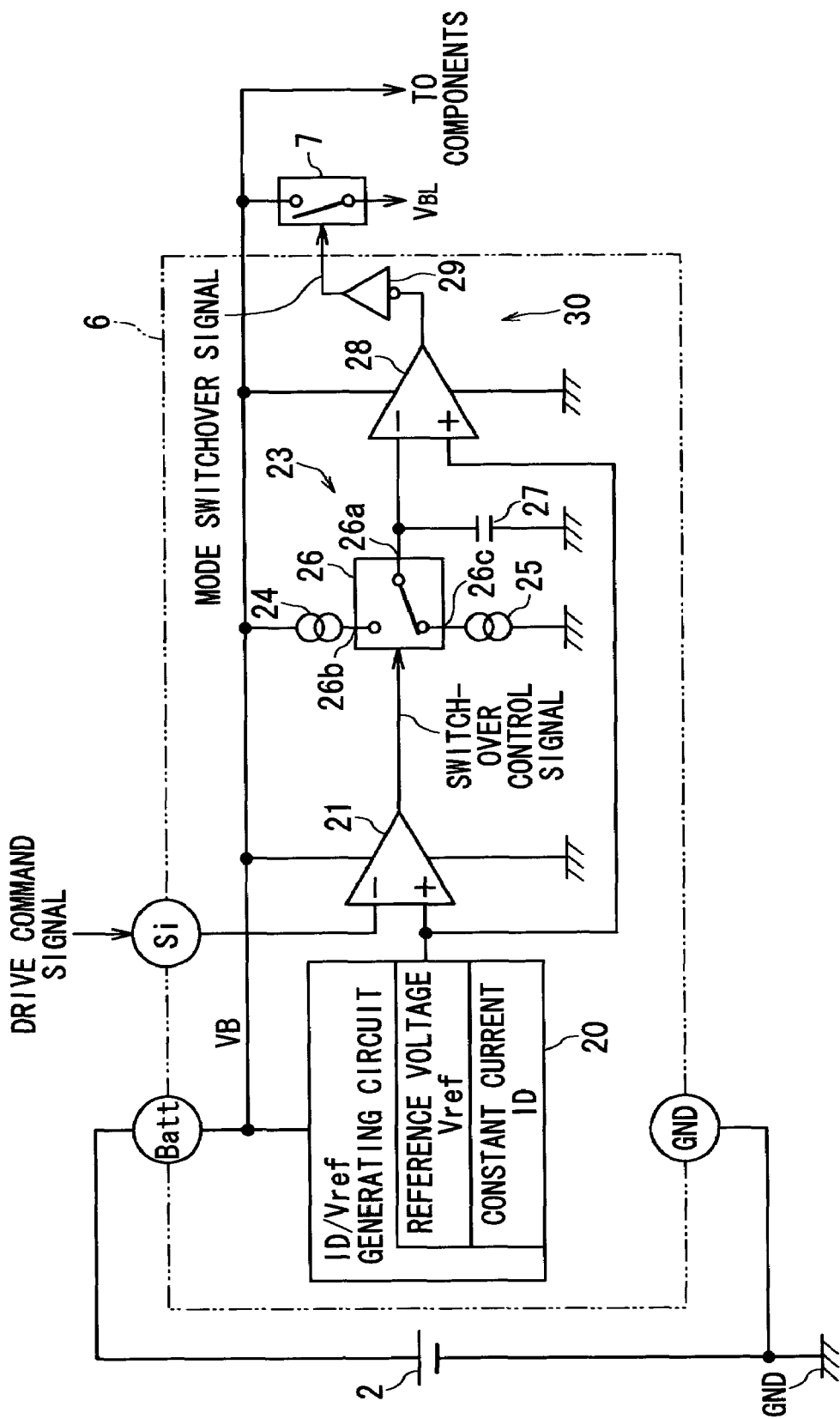
FIG. 6 shows the circuitry of a stand-by circuit employed in a load drive control apparatus according to a second embodiment of the present invention.
Figure 7:
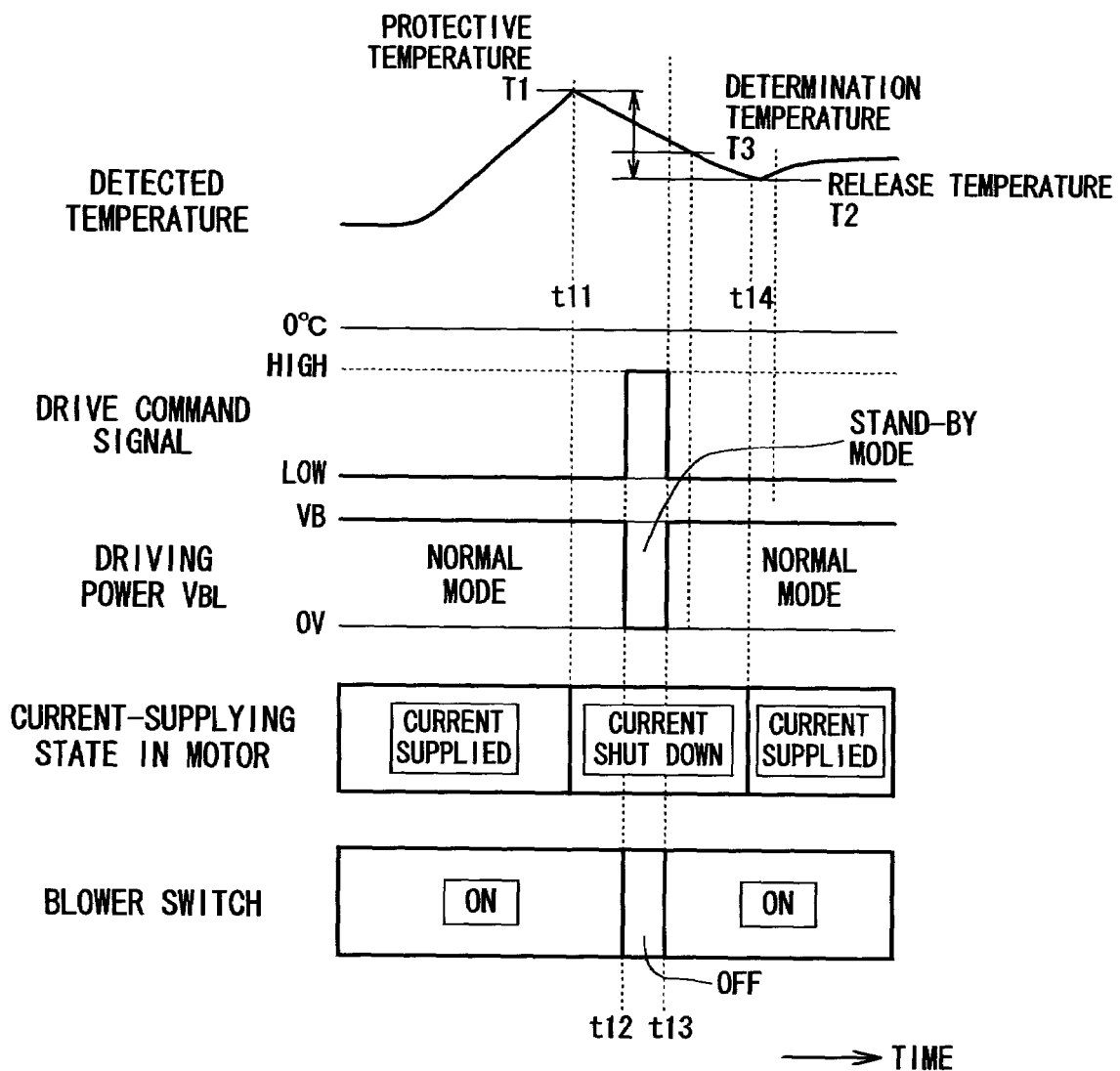
FIG. 7 is a timing chart explaining the operations carried out by the second embodiment.

Referring to FIGS. 6 and 7, a second embodiment of the load drive control apparatus according to the present invention will now be described. In the following embodiments, for the sake of simplified explanation, the identical or similar constituents employed by the foregoing first embodiment are referenced using the same numerals.

The load drive control apparatus according to the second embodiment uses the same configuration as one employed by the foregoing first embodiment, except the stand-by circuit. The second embodiment uses a stand-by circuit 50 shown in FIG. 6. As shown in FIG. 6, the OR gate 22, which is placed between the comparator 21 and the charge/discharge switchover circuit 23 in FIG. 4 illustrating the first embodiment, is omitted. The remaining of the stand-by circuit 50 shown in the FIG. 6 is the same as that used in FIG. 4. Accordingly, since the overheat signal is not taken into the stand-by circuit 50.

Instead of the above configuration, the control circuit 9 incorporated in the drive control circuit 8 performs temperature control shown in FIG. 7. Practically, the overheat protection processor 18, which is incorporated in the control circuit 9, monitors a signal detected by the temperature sensor 17, and responds to each of predetermined temperature thresholds T1, T2 and T3.

The temperatures T1 and T2, which serve as a protective temperature and a release temperature, have the identical functions explained in the first embodiment. The temperature T3 (T1>T3>T2), which is additionally introduced to the control in this second embodiment, is previously set to an amount higher than saturation temperate in the steady use and assures that the temperature at the chips (FETs 11 to 16) still remains below a guarantee temperature when the driving power $V_{BL}$ is continuously supplied to the chips after starting to stop supplying the power to the motor 4 at the protective temperature T1. As a result, the overheat protection processor 18 is able to examine the state of the temperature immediately after the stand-by mode is released.

As typically illustrated in FIG. 7, at a time instant t11 when the temperature detected at a location nearer to the FETs 11 to 16 exceeds the protective temperature T1, the current supply to the motor 4 is stopped by turning off the FETs 11 to 16, with the result that an overheat protection operation is initiated and continued until the detected temperature reduced down to the release temperature T2.

In response to turning off the blower switch at a time instant t12, the operation mode is shifted from the normal mode to the stand-by mode, so that the driving power $V_{BL}$ to the drive control circuit 8 is shut down temporarily. Further, when the blower switch is manually operated to return to its on-state at a time instant T13, the overheat protection processor 18 will immediately take a step to determine whether or not the detected temperature is over the foregoing determination temperature T3.

If this determination shows that the detected temperature is still higher the temperature T3, the control circuit 9 responds to such determination by keeping the off-state of the FETs 11 to 16 (i.e., the motor 4 keeps stopping, as shown in FIG. 7).

In contrast, when the determination is that the detected temperature is equal to or less than the temperature T3, that is, the temperature of the FETs 11 to 16 has already been lowered sufficiently, the control circuit 9 will allow the FETs 11 to 16 to shift into their on-states (i.e., the motor 4 starts to rotate again). At this stage, since the temperature of the FETs 11 to 16 is fully lowered, the FETs 11 to 16 are prevented from being damaged, thus being protected a higher temperature.

Accordingly, the temperature control based on the additionally set temperature threshold T3 is still advantageous in preventing an overheat at the FETs 11 to 16, as explained in the first embodiment, with the configuration for the control simplified more than that in the first embodiment.

Third Embodiment

Figure 8:
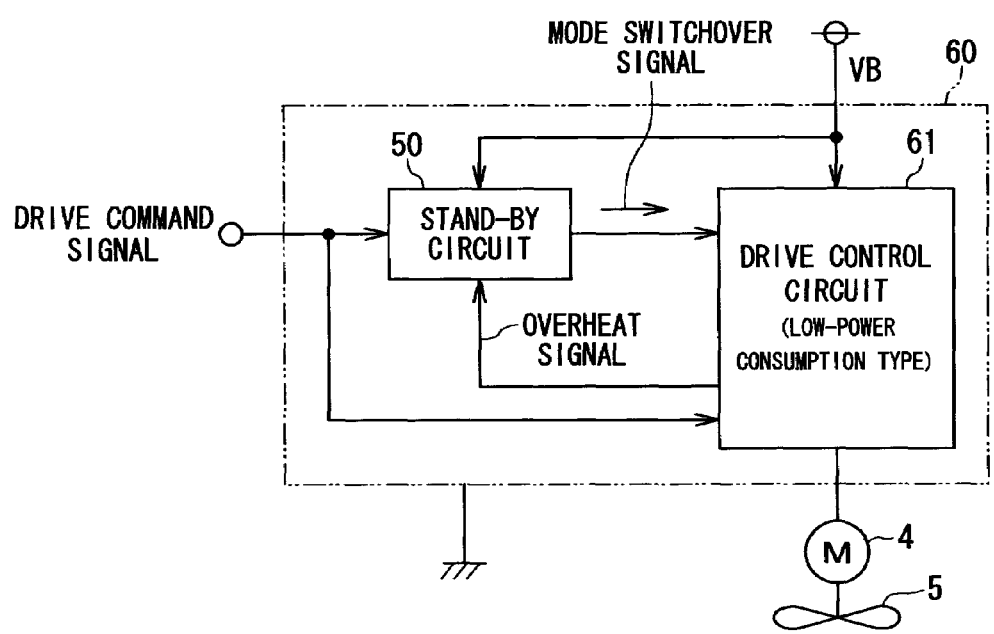
FIG. 8 is a functional block diagram showing the entire electrical configuration of a load drive control apparatus according to a third embodiment of the present invention.
Figure 9:
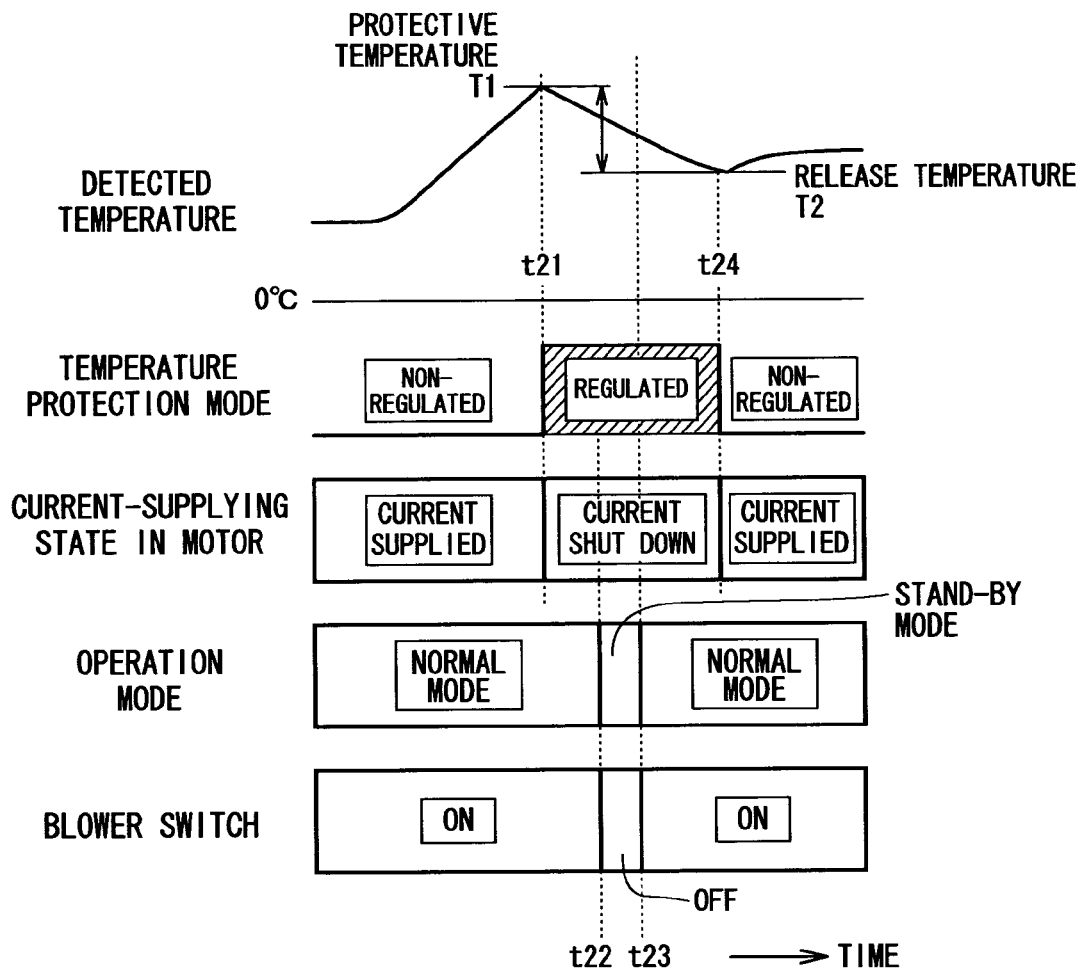
FIG. 9 is a timing chart explaining the operations carried out by the third embodiment.

Referring to FIGS. 8 and 9, a third embodiment of the present invention will now be described.

FIG. 8 outlines the entire configuration of a load drive control apparatus 60, in which there are provided the stand-by circuit 50 that has been explained in the second embodiment and a drive control circuit 61.

Figure 1A:
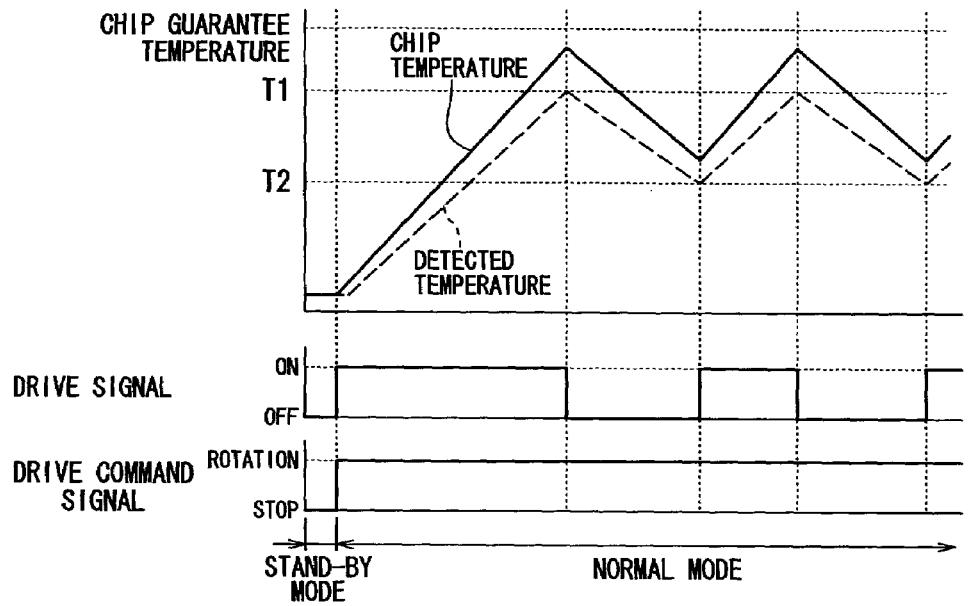
FIGS. 1A and 1B illustrate operations realized by a simply combined configuration of a conventional load drive control apparatus and conventional overheat protection control mans, the combined configuration being under an overload state.
Figure 1B:
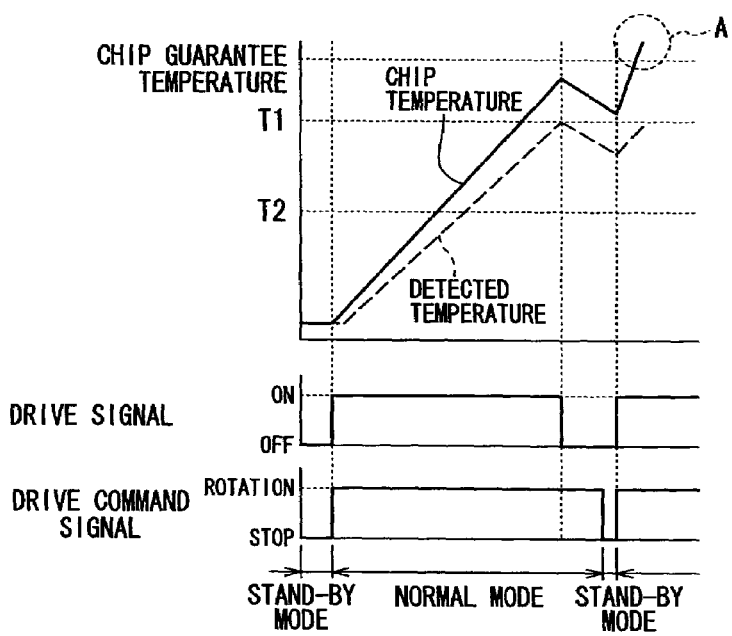

The drive control circuit 61 is made of a low-power-consumption type of circuit, whose entire circuitry or whose only digital processing part is manufactured through the CMOS process. This drive control circuit 61 is internally and integrally provided with a digital circuit for control, a memory, and a power supply circuit which was separate from the drive control circuit as shown in FIG. 1. Accordingly, the drive control circuit 61 consumes less power compared to, at least, the circuitry of the drive control circuit 8 shown in FIG. 2.

An operation carried out cooperatively by both of the stand-by circuit 6 and the drive control circuit 61 will now be described with reference to FIG. 9.

When the overheat signal coming from the drive control circuit 61 shows that the temperature of switching elements, such as FETs, embedded in the circuit 61 reaches the protective temperature T1 at a time instant t21, an overheat protection control is started as explained before. At this timing of t21, the drive control circuit 61 also memorizes information (i.e., temperature rise) indicative that the temperature has risen up to the predetermined upper limit T1 That is, a temperature protection mode is transferred from a currently set non-regulated mode to a regulated mode at the time instant t21.

In response to turning off the blower switch at a time instant t22, the operation mode is shifted from the normal mode to the stand-by mode. During this stand-by mode, the power consumption is not stopped in the drive control circuit 61, but suppressed to an extremely smaller amount.

Further, when the blower switch is manually operated to return to its on-state at a time instant t23, the drive control circuit 61 will immediately take a step to determine whether or not there is the memorized information indicative of the temperature rise. If such information is memorized in the internal memory, the drive control circuit 61 will shut down the supply of the current to the motor 4 until the detected temperature reduces down to a temperature equal to or less than the release temperature T2 (refer to a time instant t24).

In cases where it is found at the time instant t24 that the temperature is equal to or less than the release temperature T2, the memorized information indicating the temperature rise is reset.

If it is impossible for the drive control circuit 61 to monitor the temperature during the stand-by mode, the circuit 61 monitors the temperature on the release of the stand-by mode (at the time instant t23 in FIG. 9). When this detection shows that the temperature is still over the release temperature T2, the shutdown of current to the motor 4 is maintained. On the other hand, if the temperature is reduced down to a temperature equal to or less than the release temperature T2, the circuit 61 takes steps to reset the memorized information indicating the temperature rise and supply current to the motor 4, as described above.

Accordingly, according to the temperature control in the present embodiment, even if the drive control circuit 61 is made of a low-power-consumption type of circuit, an excessive rise in the temperature can be suppressed without fail.

Fourth Embodiment

Figure 10:
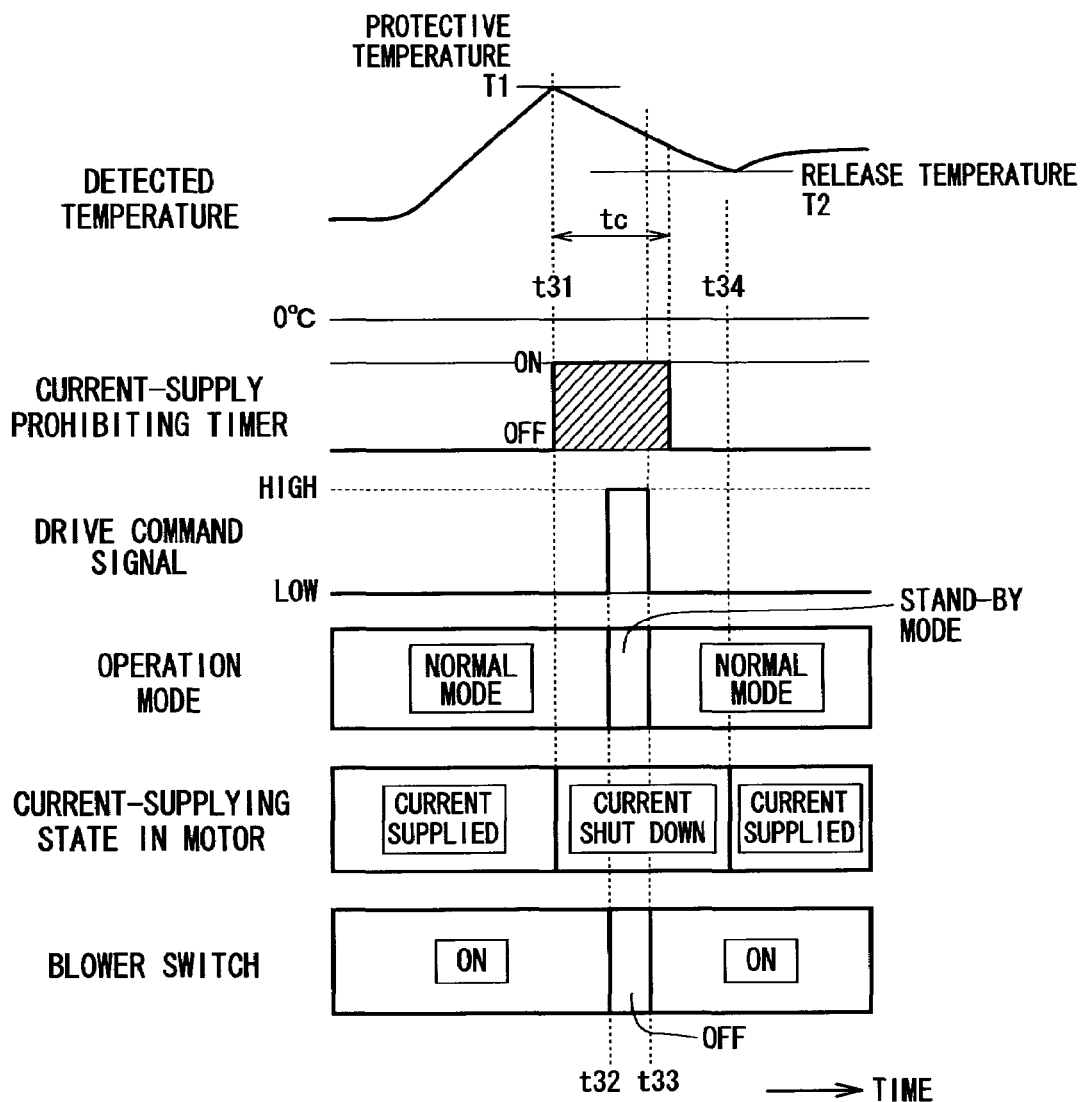
FIG. 10 is a timing chart explaining the operations carried out by a fourth embodiment of the present invention.

Referring to FIG. 10, a fourth embodiment of the present embodiment will now be described. This embodiment is one of modifications of the configuration of the third embodiment.

When the overheat signal coming from the drive control circuit 61 shows that the temperature of switching elements, such as FETs, embedded in the circuit 61 reaches the protective temperature T1 at a time instant t31, an overheat protection control is started as explained before. At this timing of t31, the drive-control circuit 61 activates a current-supply prohibiting timer Tpr installed therein. This timer Tpr counts a duration during "tc" during which current supply to the motor 4 should be prohibited at a minimum.

In response to turning off the blower switch at a time instant t32, the operation mode is shifted from the normal mode to the stand-by mode. During this stand-by mode, the power consumption is not stopped in the drive control circuit 61, but suppressed to an extremely small amount.

Further, when the blower switch is manually operated to return to its on-state at a time instant t33, the drive control circuit 61 will immediately take steps to determine whether or not the current-supply prohibiting timer Tpr is still in operation. If this determination reveals that the current-supply prohibiting timer Tpr is still in operation, the drive control circuit 61 maintains the shutdown of the current supply to the motor 4 until the detected temperature reduces down to a temperature equal to or less than the release temperature T2 (refer to a time instant t34). In contrast, if the duration counted by the current-supply prohibiting timer Tpr has already elapsed, the drive control circuit 61 will permit the current supply to the motor 4.

Accordingly, similarly to that explained in the third embodiment, even if the drive control circuit 61 is made of a low-power-consumption type of circuit, an excessive rise in the temperature can be suppressed without fail.

The configurations of the present invention will not be limited to ones described above, but there can be provided a variety of modifications or developments.

Any configurations can be applicable to the present invention, as long as the switchover from the normal mode to the stand-by mode is prohibited during the overheat protection operation. For example, in place of the OR gate 22 arranged between the comparator 21 and the switchover control circuit 26, an OR gate may be placed between the inverter 29 and the power supply circuit 7. In this example, the inverter 29, the power supply circuit 7 and the OR gate compose a power supply control circuit.

The configuration for detecting the temperature can also be modified as follows. A target at which the temperature is detected is not limited to the FETs 11 to 16. For example, the temperature of the motor 4 serving as a load may be detected to prevent the overheat of the motor 4 based on a temperature detected thereat. By way of example, the temperature detection can be performed at a plurality of positions on FETs 11 to 16, motor 4, and others, where whenever any of the temperatures is over a predetermined protective temperature, the foregoing overheat protection is started.

Another modification is provided, in which the number of rotations of the motor 4 is instructed according to a frequency of the foregoing drive command signal provided in the form of a pulsed signal. Alternatively, the number of rotations of the motor 4 can be given depending on a level of the foregoing drive command signal. Still alternatively, the number of rotations of the motor 4 can be specified by a serial signal having a predetermined number of bits, which is derived from the foregoing drive command signal.

Still, the switching elements that composing the drive circuit 10 will also not be confined to FET chips, but may be bipolar transistors or IGBTs.

The motor may be one selected from a variety of types of motor including a D.C. motor with a brush, synchronous motor, inductive motor, or others, each requiring its own drive circuit whose configurations are changed type by type. Additionally, the load in the present invention is not limited to the motor, but can be applied to any eclectic load.

For the sake of completeness, it should be mentioned that the various embodiments explained so far are not definitive lists of possible embodiments. The expert will appreciates that it is possible to combine the various construction details or to supplement or modify them by measures known from the prior art without departing from the basic inventive principle. By way of example, the disclosure, especially FIGS. 12 to 14, of U.S. Pat. No. 6,232,758 can be incorporated herein by reference. Such disclosures can also be applied to or combined with the configurations of the present invention,

What is claimed is:

1. An apparatus for driving and controlling a load being driven, comprising:
   a drive control circuit, which operates on a driving power to be supplied thereto, for controlling a drive of the load responsive to a control signal given depending on how to drive the load, the control of the load including an overheat protection control performed with a hysteresis characteristic of a temperature of at least one of a component placed in the drive control circuit and the load, the overheat protection control involving a drive-limiting operation limiting the drive of the load when an overheat state is detected based on the temperature, the hysteresis characteristic of the temperature having an upper temperature and a lower temperature; and
   a mode switchover circuit for switching the driving power used in the drive control circuit between a normal mode and a stand-by mode in response to the control signal, the stand-by mode stopping the driving power to the load and the normal mode allowing the driving power to be supplied to the load,
   wherein either the drive control circuit or the mode switchover circuit has means for prohibiting a transition from the normal mode to the stand-by mode during the drive-limiting operation regardless of a value of the control signal, as long as the temperature is higher than the lower temperature.

2. The apparatus according to claim 1, wherein the mode switchover circuit includes the prohibiting means.

3. The apparatus according to claim 2, further comprising a power supply circuit for supplying the driving power to the drive control circuit using a power supply voltage provided to the power supply circuit,
   wherein the mode switchover circuit is configured to allow the power supply circuit to mutually be switched between the normal mode and the stand-by mode in response to the control signal.

4. The apparatus according to claim 3, wherein the drive control circuit has an overheat protection processor for performing the overheat protection control that starts the drive-limiting operation responsive to a condition that the temperature reaches the upper temperature (T1) and ends the drive-limiting operation responsive to another condition that the temperature is equal to or lower than the lower temperature (T2; T2<T1)).

5. The apparatus according to claim 3, wherein the drive control circuit includes a temperature sensor to detect the temperature at the component of the drive control circuit.

6. The apparatus according to claim 5, wherein the drive control circuit includes a drive circuit in which switching elements are provided, as the component of the drive control circuit, to output current to the load, and a control circuit for enabling an on/off control to be performed at the drive circuit for driving and controlling the load and performing the overheat protection control.

7. The apparatus according to claim 3, wherein the mode switchover circuit includes
   a capacitor;
   a charge/discharge switchover circuit configured to allow the capacitor to be charged or discharged selectively in response to a switchover-control signal;
   a switchover-signal production circuit configured to supply the control signal as the switchover-control signal during a period of time during which the drive-limiting operation is not carried out and to supply a charge-operation signal to command a charge of the capacitor during another period of time during which the drive-limiting operation is carried out; and
   a power-supply control circuit configured to control the power supply circuit into a power-supplied state thereof in cases where a terminal voltage of the capacitor is equal to or higher than a predetermined switchover level and to control the power supply circuit into a power-stopped state thereof in cases where the terminal voltage of the capacitor is lower than the predetermined switchover level.

8. The apparatus according to claim 3, wherein the mode switchover circuit includes
   a capacitor;
   a charge/discharge switching-over circuit configured to allow the capacitor to be charged or discharged selectively in response to a switchover-control signal; and
   a power-supply control circuit configured to selectively control the power supply circuit into a power-supplied state or a power-stopped state thereof in accordance with a terminal voltage of the capacitor, a switchover to the power-supplied state being prohibited during a period of time during which the overheat-protecting operation is carried out.

9. An apparatus for driving and controlling a load being driven, comprising:
   a drive control circuit, which operates on a driving power to be supplied thereto, for controlling a drive of the load responsive to a control signal given depending on how to drive the load, the control of the load including an overheat protection control performed with a hysteresis characteristic of a temperature of at least one of a component placed in the drive control circuit and the load, the overheat protection control involving a drive-limiting operation limiting the drive of the load when an overheat state is detected based on the temperature, the hysteresis characteristic of the temperature having an upper temperature and a lower temperature; and
   a mode switchover circuit for switching the driving power used in the drive control circuit between a normal mode and a stand-by mode in response to the control signal, the stand-by mode stopping the driving power to the load and the normal mode allowing the driving power to be supplied to the load,
   wherein the drive control circuit (8) includes means for starting the overheat protection control that involves the drive-limiting operation when the temperature reaches the upper temperature (T1), for determining whether or not the temperature is over a middle temperature (T3) responsive to an issue of the control signal indicating the drive of the load, and for prohibiting the drive of the load even in the normal mode until the temperature becomes equal to or smaller than the lower limit-temperature (T2; T2<T3<T1), in cases where the determination reveals that the temperature is still over the middle temperature.

10. An apparatus for driving and controlling a load being driven, comprising:

a drive control circuit, which operates on a driving power to be supplied thereto, for controlling a drive of the load responsive to a control signal given depending on how to drive the load, the control of the load including an overheat protection control performed with a hysteresis characteristic of a temperature of at least one of a component placed in the drive control circuit and the load, the overheat protection control involving a drive-limiting operation limiting the drive of the load when an overheat state is detected based on the temperature, the hysteresis characteristic of the temperature having an upper temperature and a lower temperature; and a mode switchover circuit for switching the driving power used in the drive control circuit between a normal mode and a stand-by mode in response to the control signal, the stand-by mode stopping the driving power to the load and the normal mode allowing the driving power to be supplied to the load, wherein the drive control circuit includes means for memorizing information indicative a temperature rise when the temperature reaches the upper temperature, means for determining whether or not the information has been memorized in response to an issue of the control signal indicating the drive of the load; and means for prohibiting the drive of the load even in the normal mode until the temperature becomes equal to or smaller than the lower temperature, in cases where the determination reveals that the information has been memorized.

11. The apparatus according to claim 10, wherein the drive control circuit is made of a low-power-consumption type of circuit manufactured through a CMOS (complementary metal-oxide semiconductor) process.

12. An apparatus for driving and controlling a load being driven, comprising:

a drive control circuit, which operates on a driving power to be supplied thereto, for controlling a drive of the load responsive to a control signal given depending on how to drive the load, the control of the load including an overheat protection control performed with a hysteresis characteristic of a temperature of at least one of a component placed in the drive control circuit and the load, the overheat protection control involving a drive-limiting operation limiting the drive of the load when an overheat state is detected based on the temperature, the hysteresis characteristic of the temperature having an upper temperature and a lower temperature; and a mode switchover circuit for switching the driving power used in the drive control circuit between a normal mode and a stand-by mode in response to the control signal, the stand-by mode stopping the driving power to the load and the normal mode allowing the driving power to be supplied to the load wherein the drive control circuit includes, means for actuating a timer to count a predetermined period of time when the temperature reaches the upper temperature, means for determining whether or not the timer has been actuated in response to an issue of the control signal indicating the drive of the load; and means for prohibiting the drive of the load even in the normal mode until the temperature becomes equal to or smaller than the lower temperature, in cases where the determination reveals that the timer has been actuated.

13. The apparatus according to claim 12, wherein the drive control circuit is made of a low-power-consumption type of circuit manufactured through a CMOS (complementary metal-oxide semiconductor) process.

14. The apparatus according to claim 1, wherein the load includes an electrically inductive element.

15. The apparatus according to claim 1, wherein the component placed in the drive control circuit is a switching element for outputting current to the load under the control of the control signal.

16. An apparatus for driving and controlling a load being driven, comprising:

a power supply circuit producing a driving power from a power supply voltage supplied thereto depending on a normal mode and a stand-by mode, the stand-by mode stopping the driving power to the load and the normal mode allowing the driving power to be supplied to the load;

a drive control circuit, which operates on the driving power to be supplied thereto, for controlling a drive of the load responsive to a control signal given depending on how to drive the load;

an overheat protection processor performing an overheat protection control with a hysteresis characteristic of a temperature of at least one of a component placed in the drive control circuit and the load, the overheat protection control involving a drive-limiting operation limiting the drive of the load when an overheat state is detected based on the temperature, the hysteresis characteristic of the temperature having an upper temperature and a lower temperature;

a mode switchover circuit for switching the power supply circuit between the normal mode and the stand-by mode in response to the control signal; and switchover prohibiting means for prohibiting a transition from the normal mode to the stand-by mode during the drive-limiting operation regardless of a value of the control signal as long as the temperature is higher than the lower temperature.

17. The apparatus according to claim 16, wherein the mode switchover circuit includes the switchover prohibiting means.

18. The apparatus according to claim 17, wherein the drive control circuit comprises the overheat protection processor for performing the overheat protection control that starts the drive-limiting operation responsive to a condition that the temperature reaches the upper temperature (T1) and ends the drive-limiting operation responsive to another condition that the temperature is equal to or lower than the lower temperature (T2; T2<T1); and a temperature sensor to detect the temperature at the component of the drive control circuit.

19. The apparatus according to claim 18, wherein the component placed in the drive control circuit is a switching element for outputting current to the load under the control of the control signal.

* * * * *